(12) United States Patent
Blanchard

(10) Patent No.: US 7,531,850 B2
(45) Date of Patent: May 12, 2009

(54) SEMICONDUCTOR DEVICE INCLUDING A MEMORY CELL WITH A NEGATIVE DIFFERENTIAL RESISTANCE (NDR) DEVICE

(75) Inventor: Richard A. Blanchard, Los Altos, CA (US)

(73) Assignee: Mears Technologies, Inc., Waltham, MA (US)

( * ) Notice: Subject to any disclaimer, the term of this patent is extended or adjusted under 35 U.S.C. 154(b) by 549 days.

(21) Appl. No.: 11/420,876

(22) Filed: May 30, 2006

(65) Prior Publication Data

US 2006/0202189 A1 Sep. 14, 2006

Related U.S. Application Data

(63) Continuation-in-part of application No. 10/992,422, filed on Nov. 18, 2004, now Pat. No. 7,071,119, which is a continuation of application No. 10/647,060, filed on Aug. 22, 2003, now Pat. No. 6,958,486, which is a continuation-in-part of application No. 10/603,696, filed on Jun. 26, 2003, now abandoned, and a continuation-in-part of application No. 10/603,621, filed on Jun. 26, 2003, now abandoned.

(60) Provisional application No. 60/685,995, filed on May 31, 2005.

(51) Int. Cl.
*H01L 29/74* (2006.01)
*H01L 31/111* (2006.01)

(52) U.S. Cl. .................. 257/107; 257/115; 257/133; 257/157

(58) Field of Classification Search ............ 257/15, 257/18, 22, 28, 107, 115, 133, 157
See application file for complete search history.

(56) References Cited

U.S. PATENT DOCUMENTS

| 4,485,128 A | 11/1984 | Dalal et al. ............ 427/85 |
| 4,594,603 A | 6/1986 | Holonyak, Jr. .......... 357/16 |
| 4,882,609 A | 11/1989 | Schubert et al. ........ 357/22 |
| 4,908,678 A | 3/1990 | Yamazaki .............. 357/4 |

(Continued)

FOREIGN PATENT DOCUMENTS

EP 0 843 361 5/1998

(Continued)

OTHER PUBLICATIONS

Luo et al., *Chemical Design of Direct-Gap Light-Emitting Silicon*, published Jul. 25, 2002, The American Physical Society; vol. 89, No. 7.

(Continued)

*Primary Examiner*—Thien F Tran
(74) *Attorney, Agent, or Firm*—Allen, Dyer, Doppelt, Milbrath & Gilchrist, P.A.

(57) ABSTRACT

A semiconductor device may include at least one memory cell comprising a negative differential resistance (NDR) device and a control gate coupled thereto. The NDR device may include a superlattice including a plurality of stacked groups of layers, with each group of layers of the superlattice including a plurality of stacked base semiconductor monolayers defining a base semiconductor portion and at least one non-semiconductor monolayer constrained within a crystal lattice of adjacent base semiconductor portions.

24 Claims, 7 Drawing Sheets

U.S. PATENT DOCUMENTS

| | | | | |
|---|---|---|---|---|
| 4,937,204 | A | 6/1990 | Ishibashi et al. | 437/110 |
| 4,969,031 | A | 11/1990 | Kobayashi et al. | 357/63 |
| 5,055,887 | A | 10/1991 | Yamazaki | 357/4 |
| 5,081,513 | A | 1/1992 | Jackson et al. | 357/23.7 |
| 5,216,262 | A | 6/1993 | Tsu | 257/17 |
| 5,357,119 | A | 10/1994 | Wang et al. | 257/18 |
| 5,577,061 | A | 11/1996 | Hasenberg et al. | 372/45 |
| 5,594,567 | A | 1/1997 | Akiyama et al. | 349/28 |
| 5,606,177 | A | 2/1997 | Wallace et al. | 257/25 |
| 5,616,515 | A | 4/1997 | Okuno | 438/478 |
| 5,627,386 | A | 5/1997 | Harvey et al. | 257/79 |
| 5,683,934 | A | 11/1997 | Candelaria | 437/134 |
| 5,684,817 | A | 11/1997 | Houdre et al. | 372/45 |
| 5,994,164 | A | 11/1999 | Fonash et al. | 438/97 |
| 6,058,127 | A | 5/2000 | Joannopoulos et al. | 372/92 |
| 6,229,161 | B1 | 5/2001 | Nemati et al. | 257/133 |
| 6,255,150 | B1 | 7/2001 | Wilk et al. | 438/191 |
| 6,274,007 | B1 | 8/2001 | Smirnov et al. | 204/192 |
| 6,281,518 | B1 | 8/2001 | Sato | 257/13 |
| 6,281,532 | B1 | 8/2001 | Doyle et al. | 257/288 |
| 6,326,311 | B1 | 12/2001 | Ueda et al. | 438/694 |
| 6,344,271 | B1 | 2/2002 | Yadav et al. | 428/402 |
| 6,350,993 | B1 | 2/2002 | Chu et al. | 257/19 |
| 6,376,337 | B1 | 4/2002 | Wang et al. | 438/478 |
| 6,436,784 | B1 | 8/2002 | Allam | 438/380 |
| 6,448,586 | B1 * | 9/2002 | Nemati et al. | 257/133 |
| 6,472,685 | B2 | 10/2002 | Takagi | |
| 6,498,359 | B2 | 12/2002 | Schmidt et al. | 257/190 |
| 6,501,092 | B1 | 12/2002 | Nikonov et al. | 257/29 |
| 6,521,519 | B2 | 2/2003 | Shimizu et al. | 438/786 |
| 6,566,679 | B2 | 5/2003 | Nikonov et al. | 257/29 |
| 6,608,327 | B1 | 8/2003 | Davis et al. | 257/76 |
| 6,621,097 | B2 | 9/2003 | Nikonov et al. | 257/17 |
| 6,638,838 | B1 | 10/2003 | Eisenbeiser et al. | 438/481 |
| 6,646,293 | B2 | 11/2003 | Emrick et al. | 257/194 |
| 6,673,646 | B2 | 1/2004 | Droopad | 438/85 |
| 6,690,699 | B2 | 2/2004 | Capasso et al. | 372/44 |
| 6,711,191 | B1 | 3/2004 | Kozaki et al. | 372/43 |
| 6,748,002 | B2 | 6/2004 | Shveykin | 372/45 |
| 6,816,530 | B2 | 11/2004 | Capasso et al. | 372/50 |
| 2002/0094003 | A1 | 7/2002 | Bour et al. | 372/46 |
| 2003/0034529 | A1 | 2/2003 | Fitzgerald et al. | 257/369 |
| 2003/0057416 | A1 | 3/2003 | Currie et al. | 257/19 |
| 2003/0089899 | A1 | 5/2003 | Lieber et al. | 257/9 |
| 2003/0162335 | A1 | 8/2003 | Yuki et al. | 438/151 |
| 2003/0215990 | A1 | 11/2003 | Fitzgerald et al. | 438/172 |
| 2004/0084781 | A1 | 5/2004 | Ahn et al. | 257/777 |
| 2004/0227165 | A1 | 11/2004 | Wang et al. | 257/222 |
| 2006/0011940 | A1 | 1/2006 | Nemati et al. | 257/133 |

FOREIGN PATENT DOCUMENTS

| | | |
|---|---|---|
| GB | 2347520 | 9/2000 |
| JP | 61027681 | 2/1986 |
| JP | 61145820 | 7/1986 |
| JP | 61220339 | 9/1986 |
| JP | 62219665 | 9/1987 |
| WO | 99/63580 | 12/1999 |
| WO | 02/103767 | 12/2002 |

OTHER PUBLICATIONS

Tsu, *Phenomena in Silicon Nanostructure Devices*, University of North Carolina at Charlotte, Sep. 6, 2000.

Ye et al., *GaAs MOSFET with Oxide Gate Dielectric Grown by Atomic Layer Deposition*, Agere Systems, Mar. 2003.

Novikov et al., *Silicon-based Optoelectronics*, 1999-2003, pp. 1-6.

Fan et al., *N- and P-Type SiGe/Si Superlattice Coolers*, the Seventeenth Intersociety Conference on Thermomechanical Phenomena in Electronic Systems (ITherm 2000), vol. 1, pp. 304-307, Las Vegas, NV, May 2000.

Shah et al., *Experimental Analysis and Theoretical Model for Anomalously High Ideality Factors (n>2.0) in AlGaN/GaN P-N Junction Diodes*, Journal of Applied Physics, vol. 94, No. 4, Aug. 15, 2003.

Ball, *Striped Nanowires Shrink Electronics*, news@nature.com, Feb. 7, 2002.

Flory et al., *Light Emission from Silicon: Some Perspectives and Applications*, Journal of Electronic Materials, vol. 32, No. 10, 2003.

*Lecture 6: Light Emitting and Detecting Devices*, MSE 6001, Semiconductor Materials Lectures, Fall 2005.

*Harvard University Professor and Nanosys Co-Founder*, Charlie Lieber, *Raises the Stakes In the Development of Nanoscale Superlattice Structures and Nanodevices*, Feb. 8, 2002, Nanosys, Inc.

Nemati et al., *A Novel Thyristor-based SRAM Cell (T-RAM) for High-Speed, Low Voltage, Giga-scale Memories*, Electron Devices Meeting, 1999. IEDM Technical Digest. International, pp. 283-286, 1999.

* cited by examiner

SEMICONDUCTOR DEVICE INCLUDING A MEMORY CELL WITH A NEGATIVE DIFFERENTIAL RESISTANCE (NDR) DEVICE

CROSS-REFERENCE TO RELATED APPLICATIONS

This application claims the benefit of U.S. Provisional Application No. 60/685,995, filed May 31, 2005, and is a continuation-in-part of U.S. patent application Ser. No. 10/992,422 filed Nov. 18, 2004 now U.S. Pat. No. 7,071,119, which is a continuation of U.S. patent application Ser. No. 10/647,060 filed Aug. 22, 2003, now U.S. Pat. No. 6,958,486, which is a continuation-in-part of U.S. patent application Ser. Nos. 10/603,696 and 10/603,621 filed on Jun. 26, 2003 now abandoned, the entire disclosures of which are incorporated by reference herein.

FIELD OF THE INVENTION

The present invention relates to the field of semiconductors, and, more particularly, to semiconductors having enhanced properties based upon energy band engineering and associated methods.

BACKGROUND OF THE INVENTION

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electromuminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc, can be tailored to yield new aperiodic materials with desirable band-structure characteristics. Other parameters, such as electrical conductivity, thermal conductivity and dielectric permittivity or magnetic permeability are disclosed as also possible to be designed into the material.

SUMMARY OF THE INVENTION

The present invention relates to the field of semiconductors, and, more particularly, to semiconductors having enhanced properties such as may be based upon energy band engineering and associated methods.

This and other objects, features, and advantages are provided by a semiconductor device including at least one memory cell comprising a negative differential resistance (NDR) device and a control gate coupled thereto. The NDR device may include a superlattice including a plurality of stacked groups of layers, with each group of layers of the superlattice including a plurality of stacked base semiconductor monolayers defining a base semiconductor portion and at least one non-semiconductor monolayer constrained within a crystal lattice of adjacent base semiconductor portions.

By way of example, the NDR device may be a thyristor. More particularly, the thyristor may include a plurality of stacked semiconductor layers having alternating first and second conductivity types. Moreover, an uppermost layer of the stack of semiconductor layers may include the superlattice. Furthermore, at least one other layer of the plurality of stacked semiconductor layers beneath the uppermost layer may also include the superlattice, and the thyristor may further include a voltage reference contact on the uppermost layer of the plurality of stacked semiconductor layers. In addition, the control gate may be coupled between a pair of adjacent first and second conductivity type layers in the stack of semiconductor layers. The at least one memory cell may further include at least one access transistor coupled to the NDR device, and the at least one memory cell may include a plurality thereof.

With respect to the superlattice, the base semiconductor may include silicon, and the at least one non-semiconductor monolayer may include oxygen, for example. More particularly, the at least one non-semiconductor monolayer may include a non-semiconductor selected from the group consisting essentially of oxygen, nitrogen, fluorine, and carbon-oxygen. Further, at least one non-semiconductor monolayer may be a single monolayer thick. All of the base semiconductor portions may be a same number of monolayers thick, or at least some of the base semiconductor portions may be a different number of monolayers thick. Additionally, opposing base semiconductor portions in adjacent groups of layers of the at least one superlattice may be chemically bound together.

DETAILED DESCRIPTION OF THE PREFERRED EMBODIMENTS

Figure 1:
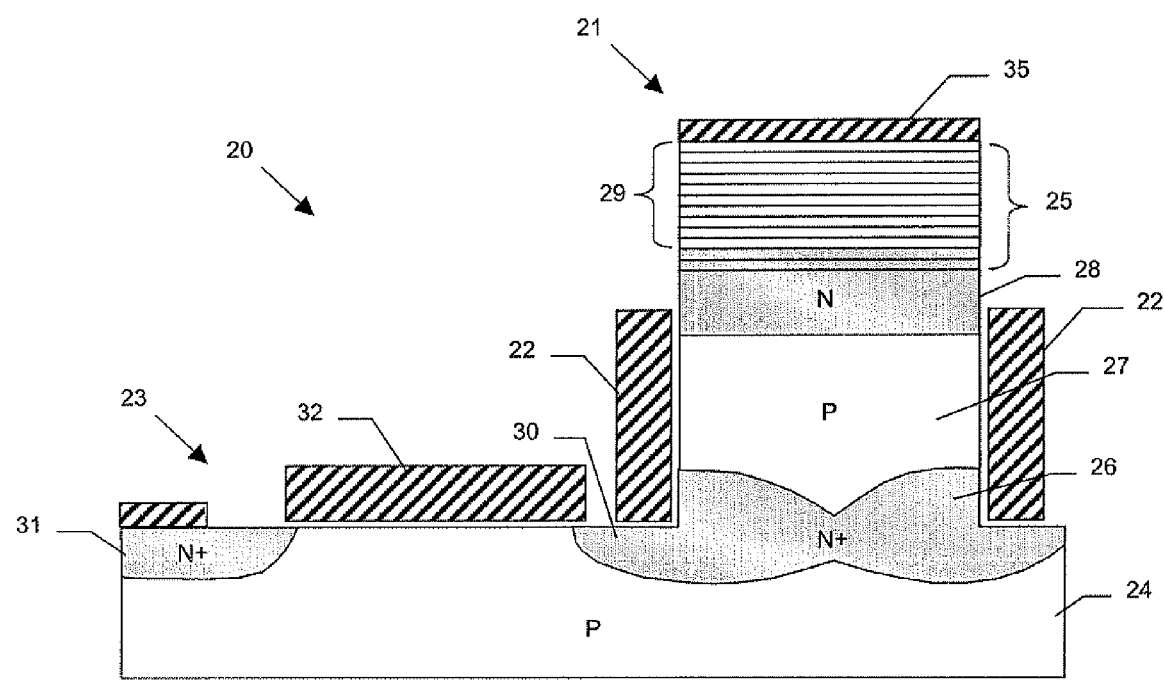
FIG. 1 is a cross-sectional view of a semiconductor device in accordance with the present invention including a superlattice.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments.

The present invention relates to controlling the properties of semiconductor materials at the atomic or molecular level to achieve improved performance within semiconductor devices. Further, the invention relates to the identification, creation, and use of improved materials for use in the conduction paths of semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) =$$

$$\frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature (Kelvin), E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Using the above described measures, one can select materials having improved band structures for specific purposes. One such example would be a superlattice 25 material used to improve temperature characteristics in a semiconductor device, such as a negative differential resistance (NDR) device. Referring more particularly to FIG. 1, one such example is a memory cell 20 which illustratively includes an NDR device, namely a thyristor 21. The memory cell 20 further includes a control gate 22 that is coupled to and surrounds the thyristor 21. An access transistor 23 is also coupled to the thyristor 21, and shares a diffused region with it.

The thyristor 21 illustratively includes a plurality of vertically stacked semiconductor layers 26 through 29 having alternating first and second conductivity types on a semiconductor substrate 24. In the present example, the semiconductor layer 26 is the bottom layer of the vertical stack and has an N conductivity type (N+), and the substrate 24 has a P conductivity type. The next layer up in the stack is the layer 27 which has a P conductivity type, and the next layer thereon is the layer 28, which has an N conductivity type. The layer 29 is the uppermost layer of the stack and it has a P conductivity type (P+).

It will be appreciated by those skilled in the art that in other embodiments the order of conductivity types in the layers may be different (e.g., P-N-P-N rather than N-P-N-P), and the relative dopant concentrations may also be different. It should also be noted that although the layers 26 through 29 are described as being "stacked" herein, this does not mean that these layers have to be separately formed or deposited. That is, a "stacked" layer may also be formed simply by doping a semiconductor region to have different conductivity types adjacent one another, as is the case with the formation of the layer 26 in the illustrated example.

The control gate 22 can be metal, doped silicon, silicide, or salicide and also serves as a first word line for the memory cell 20, as will be appreciated by those skilled in the art. The control gate 22 is coupled between a pair of layers of the stack of semiconductor layers having the same conductivity type, namely the bottom N+ layer 26 and the N layer 28 in the present example. The thyristor 21 further illustratively includes a voltage reference contact 35, which may also be metal, on the uppermost layer 29 of the stack. Other reliable contact materials may also be used.

The access transistor 23 illustratively includes source and drain regions 30, 31, which have an N conductivity type (N+). More particularly, the same doping step which forms the N+ layer 26 of the thyristor 21 layer stack also forms the drain regions 31, as will be appreciated by those skilled in the art. In addition, a gate 32 of the access transistor 23 overlies the substrate 32 and is connected between the source and drain regions 30, 31 as shown. Here again, the gate 32 can be doped silicon, silicide, or polycide metal in the exemplary embodiment and also provides a second word line for the memory cell 20. The thyristor 21 may therefore be conceptually viewed as a vertical device, and the access transistor 23 as a lateral device in the illustrated embodiment. Yet, in other embodiments different layouts or configurations of the thyristor 21 and/or access transistor 23 may be used, as will be appreciated by those skilled in the art.

The above-described memory cell 20 may be made using conventional semiconductor processing and doping techniques, as will be appreciated by those skilled in the art. Further information regarding the structure of the above-described thyristor SRAM cell (T-RAM) is provided in U.S. Pat. No. 6,229,161 to Nemati et al. (the '161 patent), which is hereby incorporated herein by reference in its entirety.

One of the factors that determines the relative performance of a T-PAM cell such as the one disclosed in the '161 patent when compared to other SKAM cells is the amount of current per cell needed to hold the cell in the "on" state. This current is reported to be in the range of 1 pA for a cylindrical cell having a diameter of 0.5 µm. Another device parameter of interest is the forward breakover voltage, VFB. This voltage is related to the forward voltage of the P+-to-N diode in the thyristor, and decreases with temperature. If VFB drops below the reference voltage VREF, the reference voltage on the anode of the thyristor, the T-RAM cell will ordinarily lose its bistable behavior.

To address this problem, in the T-RAM cell 20 the uppermost layer 29 of the stack of semiconductor layers of the thyristor 21 advantageously comprises the superlattice 25. Applicants theorize, without wishing to be bound thereto, that the structure of the band-engineered superlattice 25 will help prevent VFB from dropping below the reference voltage VREF. This is due to the behavior over temperature of the non-semiconductor energy-band modifying layer(s) present in the superlattice 25, and in particular, the change is current versus temperature to keep the cell on, as will be discussed further below.

Figure 2:
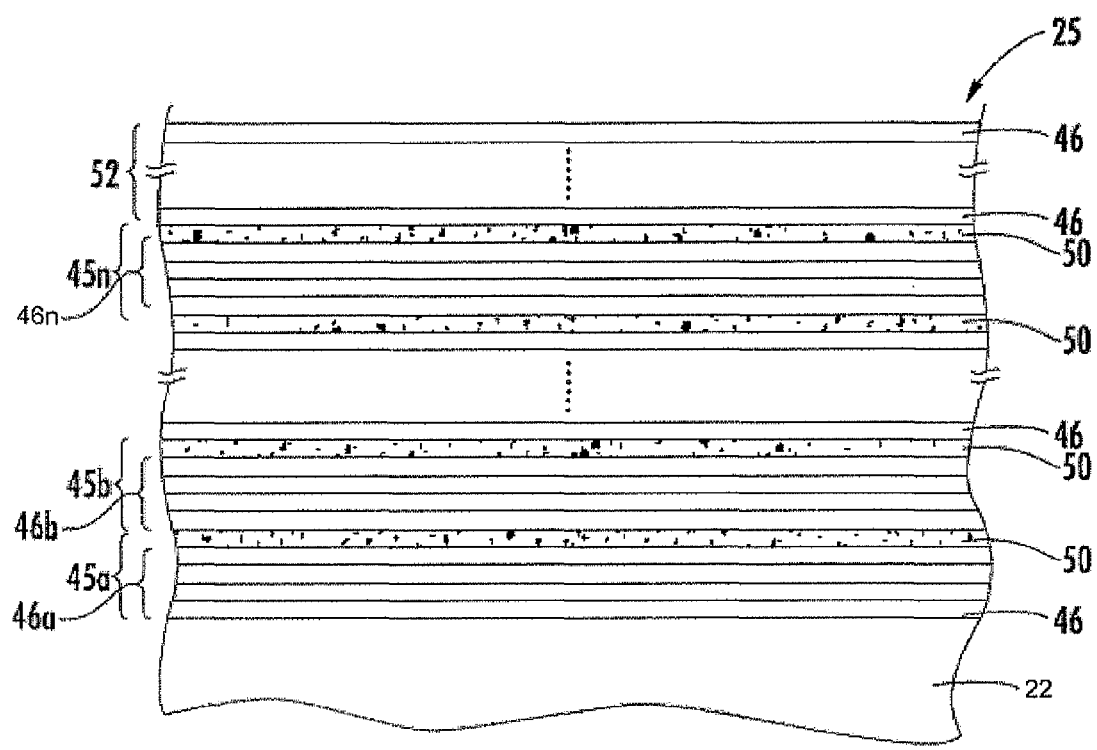
FIG. 2 is a greatly enlarged schematic cross-sectional view of the superlattice as shown in FIG. 1.
Figure 3:
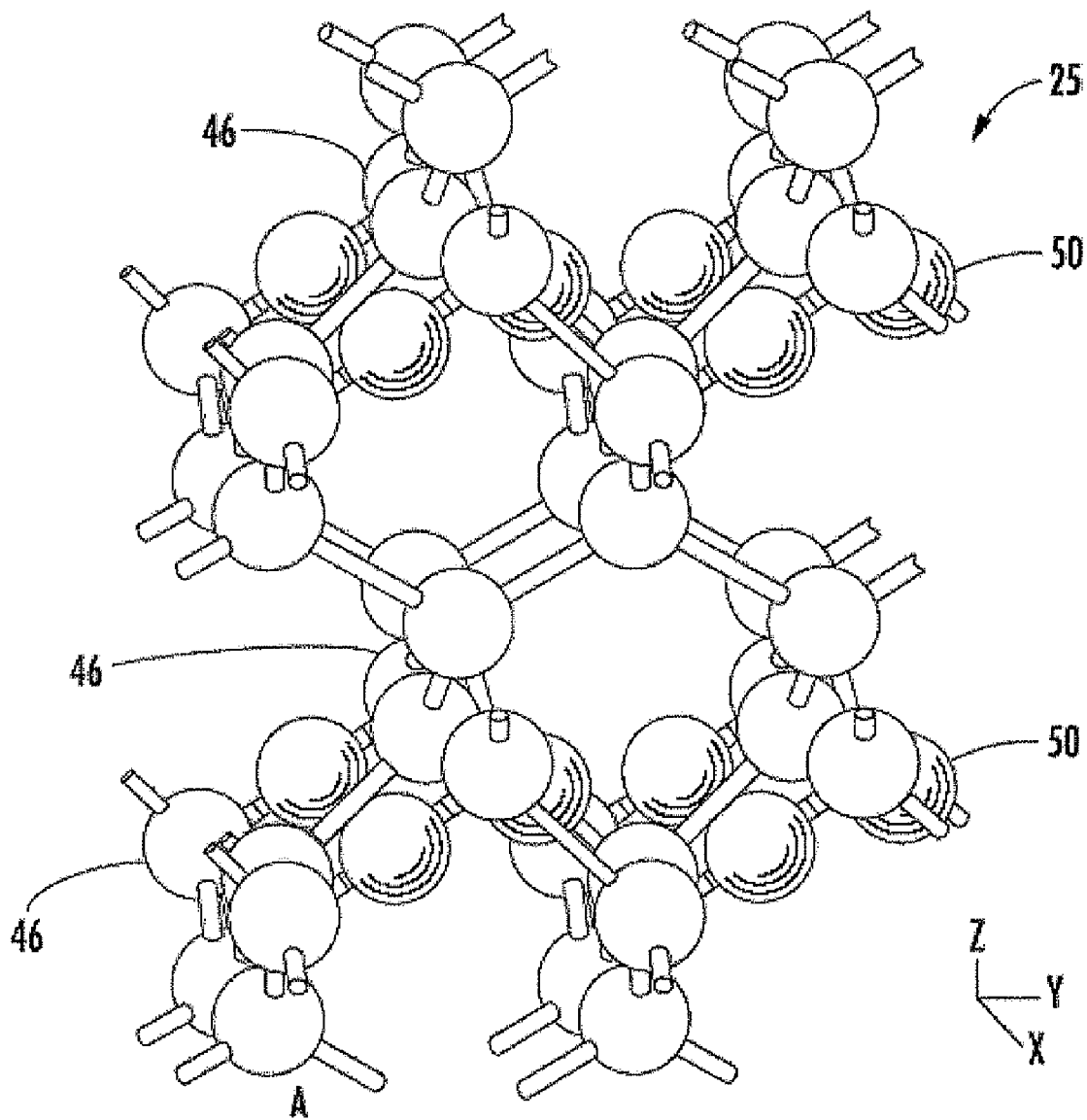
FIG. 3 is a perspective schematic atomic diagram of a portion of the superlattice shown in FIG. 2.

The superlattice 25 may occupy only a portion of the uppermost layer 29, the entire layer, or it may extend into the N layer 28 as shown in FIG. 1 or completely through the N layer (not shown). In other embodiments the superlattice 25 may instead or in addition be used in other layers or regions of the memory cell 20. Referring now additionally to FIGS. 2 and 3, the superlattice 25 has a structure that is controlled at the atomic or molecular level and may be formed using known techniques of atomic or molecular layer deposition. The superlattice 25 includes a plurality of layer groups 45a-45n arranged in stacked relation, as noted above, as perhaps best understood with specific reference to the schematic cross-sectional view of FIG. 2.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 2 for clarity of illustration.

The energy-band modifying layer 50 illustratively includes one non-semiconductor monolayer constrained within a crystal lattice of adjacent base semiconductor portions. That is, opposing base semiconductor monolayers 46 in adjacent groups of layers 45a-45n are chemically bound together. For example, in the case of silicon monolayers 46, some of the silicon atoms in the upper or top semiconductor monolayer of the group of monolayers 46a will be covalently bonded with silicon atoms in the lower or bottom monolayer of the group 46b. This allows the crystal lattice to continue through the groups of layers despite the presence of the non-semiconductor monolayer(s) (e.g., oxygen monolayer(s)). Of course, there will not be a complete or pure covalent bond between the opposing silicon layers 46 of adjacent groups 45a-45n as some of the silicon atoms in each of these layers will be bonded to non-semiconductor atoms (i.e., oxygen in the present example), as will be appreciated by those skilled in the art.

In other embodiments, more than one non-semiconductor layer monolayer may be possible. By way of example, the number of non-semiconductor monolayers in the energy band-modifying layer 50 may preferably be less than about five monolayers to thereby provide desired energy band-modifying properties.

It should be noted that reference herein to a non-semiconductor or semiconductor monolayer means that the material used for the monolayer would be a non-semiconductor or semiconductor if formed in bulk. That is, a single monolayer of a material, such as semiconductor, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice. Moreover, as noted above, this structure also advantageously provides a barrier to dopant and/or material bleed or diffusion and to carrier flow between layers vertically above and below the superlattice 25.

It is also theorized that the superlattice 25 provides a higher charge carrier mobility based upon the lower conductivity effective mass than would otherwise be present. Of course, all of the above-described properties of the superlattice 25 need not be utilized in every application. For example, in some applications the superlattice 25 may only be used for its dopant blocking/insulation properties or its enhanced mobility, or it may be used for both in other applications, as will be appreciated by those skilled in the art.

A cap layer 52 is on an upper layer group 45n of the superlattice 25. The cap layer 52 may comprise a plurality of base semiconductor monolayers 46. The cap layer 52 may have between 2 to 100 monolayers of the base semiconductor, and, more preferably between 10 to 50 monolayers. Other thicknesses may be used as well.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing, as will be appreciated by those skilled in the art.

It should be noted that the term "monolayer" is meant to include a single atomic layer and also a single molecular layer. It is also noted that the energy band-modifying layer 50 provided by a single monolayer is also meant to include a monolayer wherein not all of the possible sites are occupied. For example, with particular reference to the atomic diagram of FIG. 3, a 4/1 repeating structure is illustrated for silicon as the base semiconductor material, and oxygen as the energy band-modifying material. Only half of the possible sites for oxygen are occupied.

In other embodiments and/or with different materials this one half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without wishing to be bound thereto, that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 2 and 3, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 SilO superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers, as will be appreciated by those skilled in the art. It may also be beneficial to have a decreased carrier mobility in a direction perpendicular to the groups of layers.

The lower conductivity effective mass for the 4/1 Si/O embodiment of the superlattice 25 may be less than two-thirds the conductivity effective mass than would otherwise occur, and this applies for both electrons and holes. Of course, the superlattice 25 in the embodiment illustrated in FIG. 1 further comprises P type conductivity dopant in the uppermost layer 29, and N type conductivity in the layer 28. It may be especially appropriate to dope some portion of the superlattice 25 if the superlattice is to provide a portion of a channel, for example. In other embodiments, it may be preferably to have one or more groups of layers 45 of the superlattice 25 substantially undoped depending upon its position within the device.

Figure 4:
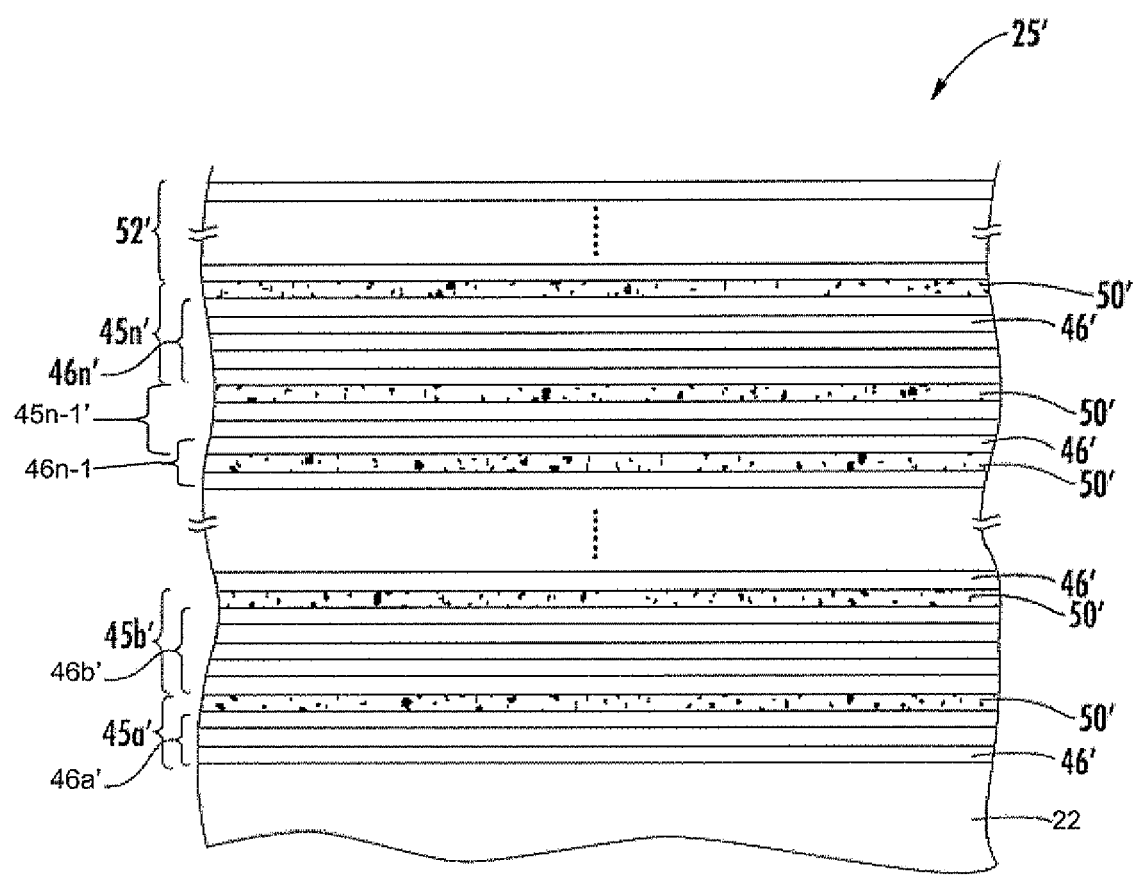
FIG. 4 is a greatly enlarged schematic cross-sectional view of another embodiment of a superlattice that may be used in the device of FIG. 1.

Referring now additionally to FIG. 4, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 4 not specifically mentioned are similar to those discussed above with reference to FIG. 2 and need no further discussion herein.

In some device embodiments, all of the base semiconductor portions 46a-46n of a superlattice 25 may be a same number of monolayers thick. In other embodiments, at least some of the base semiconductor portions 46a-46n may be a different number of monolayers thick. In still other embodiments, all of the base semiconductor portions 46a-46n may be a different number of monolayers thick.

Figure 5A:
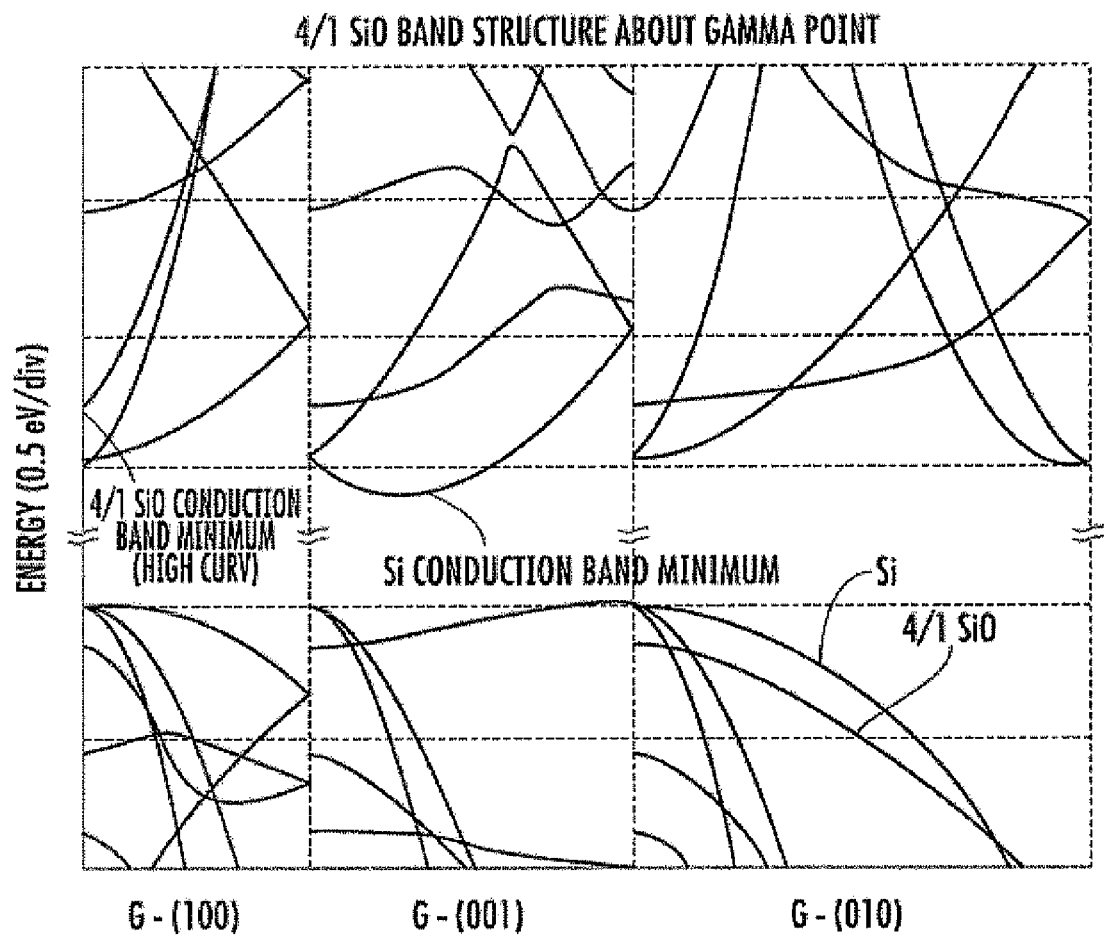
FIG. 5A is a graph of the calculated band structure from the gamma point (G) for both bulk silicon as in the prior art, and for the 4/1 Si/O superlattice as shown in FIG. 2.
Figure 5B:
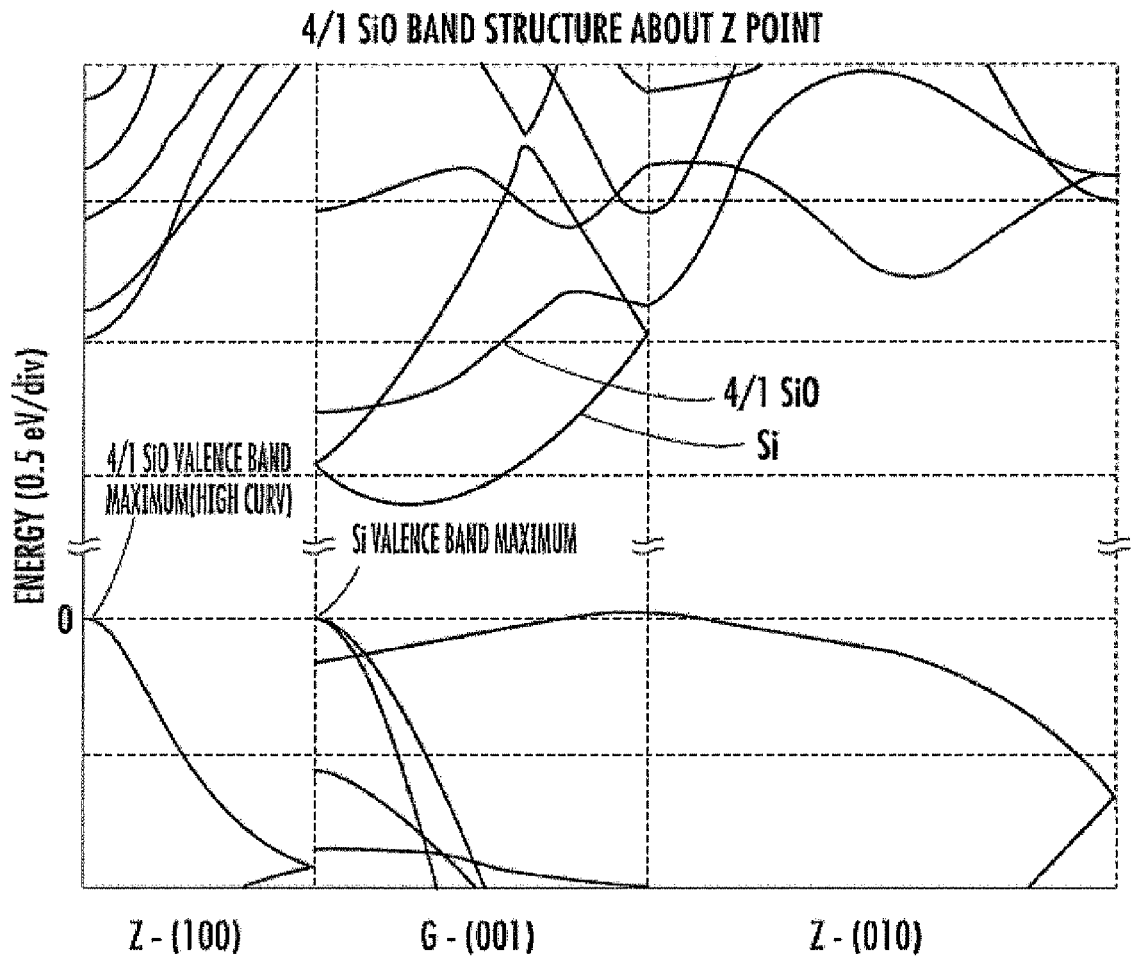
FIG. 5B is a graph of the calculated band structure from the Z point for both bulk silicon as in the prior art, and for the 4/1 Si/O superlattice as shown in FIG. 2.
Figure 5C:
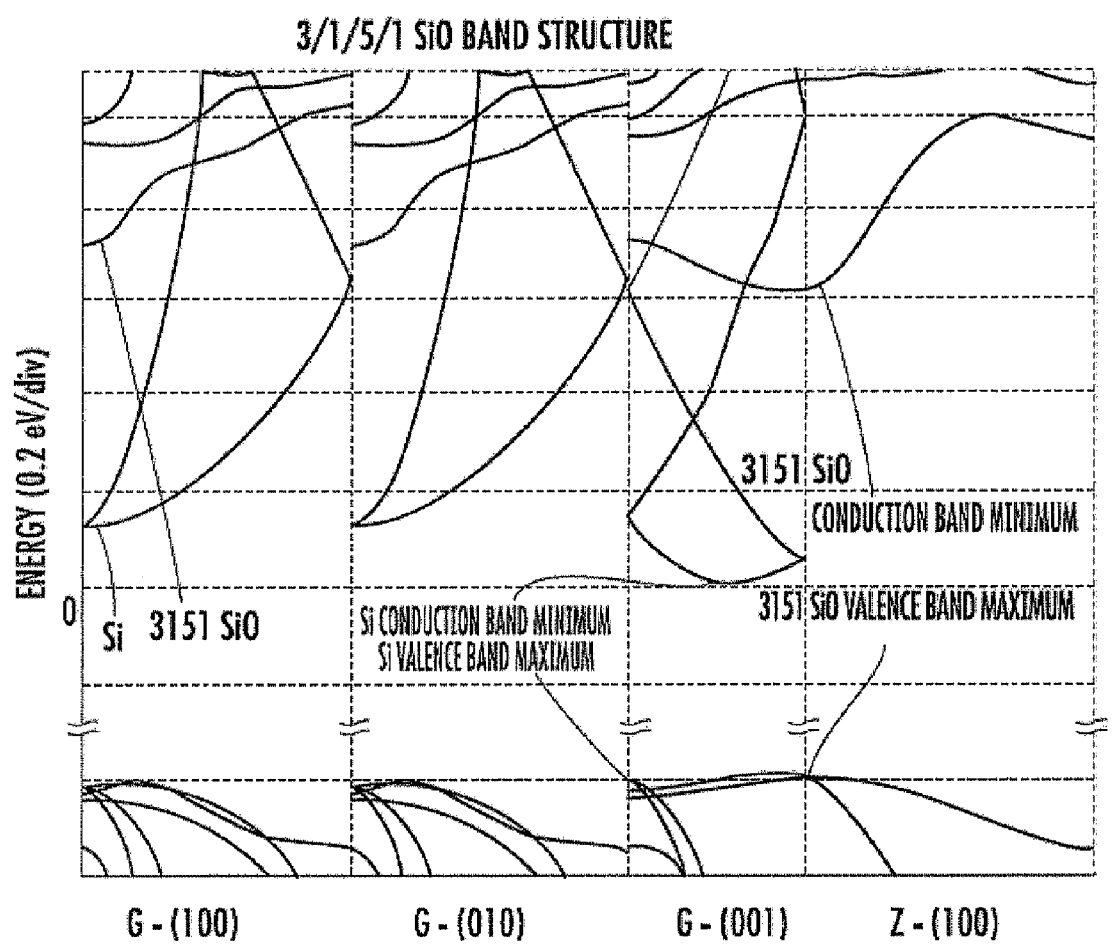
FIG. 5C is a graph of the calculated band structure from both the gamma and Z points for both bulk silicon as in the prior art, and for the 5/1/3/1 Si/O superlattice as shown in FIG. 4.

In FIGS. 5A-5C band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 5A shows the calculated band structure from the gamma point (G) for both bulk silicon (represented by continuous lines) and for the 4/1 Si/O superlattice 25 as shown in FIG. 2 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 5B shows the calculated band structure from the Z point for both bulk silicon (continuous lines) and for the 4/1 Si/O superlattice 25 (dotted lines) of FIG. 5. This figure illustrates the enhanced curvature of the valence band in the (100) direction.

FIG. 5C shows the calculated band structure from both the gamma and Z point for both bulk silicon (continuous lines) and for the 5/1/3/1 Si/O structure of the superlattice 25' of FIG. 4 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

It should be noted that the superlattice 25 may advantageously be used in other NDR device configurations beyond the T-RAM memory cell 20 shown in FIG. 1. By way of example, one such NDR device is shown in FIG. 6 of the '161 patent. Another example in which the superlattice 25 may also be incorporated is set forth in an article entitled "Full Planar 0.562 μm² T-RAM Cell in a 130 nm SOI CMOS Logic Technology for High-Density High-Performance SRAMs" to Nemati et al., IEEE, 2004, which is hereby incorporated in its entirety by reference. Moreover, it should also be noted that the superlattice 25 may be incorporated in discrete NDR/thyristor devices that are not incorporated in a memory cell.

Many modifications and other embodiments will come to the mind of one skilled in the art having the benefit of the teachings presented in the foregoing descriptions and the associated drawings. Therefore, it is understood that such modifications and embodiments are intended to be included within the scope of the appended claims.

That which is claimed is:

1. A semiconductor device comprising:
    at least one memory cell comprising a negative differential resistance (NDR) device and a control gate coupled thereto;
    said NDR device comprising a superlattice including a plurality of stacked groups of layers with each group of layers of said superlattice comprising a plurality of stacked base semiconductor monolayers defining a base semiconductor portion and at least one non-semiconductor monolayer constrained within a crystal lattice of adjacent base semiconductor portions.

2. The semiconductor device of claim 1 wherein said NDR device comprises a thyristor.

3. The semiconductor device of claim 2 wherein said thyristor comprises a plurality of stacked semiconductor layers having alternating first and second conductivity types; and wherein an uppermost layer of said stack of semiconductor layers comprises said superlattice.

4. The semiconductor device of claim 3 wherein at least one other layer of said plurality of stacked semiconductor layers beneath said uppermost layer also comprises the superlattice.

5. The semiconductor device of claim 3 wherein said thyristor further comprises a voltage reference contact on said uppermost layer of said plurality of stacked semiconductor layers.

6. The semiconductor device of claim 1 wherein said at least one memory cell further comprises at least one access transistor coupled to said NDR device.

7. The semiconductor device of claim 1 wherein said at least one memory cell comprises a plurality thereof.

8. The semiconductor device of claim 1 wherein said base semiconductor portion comprises silicon.

9. The semiconductor device of claim 1 wherein said at least one non-semiconductor monolayer comprises oxygen.

10. The semiconductor device of claim 1 wherein said at least one non-semiconductor monolayer comprises a non-semiconductor selected from the group consisting essentially of oxygen, nitrogen, fluorine, and carbon-oxygen.

11. The semiconductor device of claim 1 wherein said at least one non-semiconductor monolayer is a single monolayer thick.

12. The semiconductor device of claim 1 wherein all of said base semiconductor portions are a same number of monolayers thick.

13. The semiconductor device of claim 1 wherein at least some of said base semiconductor portions are a different number of monolayers thick.

14. The semiconductor device of claim 1 wherein opposing base semiconductor portions in adjacent groups of layers of said at least one superlattice are chemically bound together.

15. A semiconductor device comprising:
    at least one memory cell comprising a thyristor, a control gate coupled to said thyristor, and an access transistor coupled to said thyristor;
    said thyristor comprising a plurality of stacked semiconductor layers having alternating first and second conductivity types, and at least one layer of said stack of semiconductor layers comprising a superlattice;
    said superlattice including a plurality of stacked groups of layers with each group of layers of said superlattice comprising a plurality of stacked base semiconductor monolayers defining a base semiconductor portion and at least one non-semiconductor monolayer constrained within a crystal lattice of adjacent base semiconductor portions.

16. The semiconductor device of claim 15 wherein said at least one layer of said stack of semiconductor layers comprises an uppermost layer of said plurality of stacked semiconductor layers.

17. The semiconductor device of claim 16 wherein said thyristor further comprises a voltage reference contact on said uppermost layer of said plurality of stacked semiconductor layers.

18. The semiconductor device of claim 15 wherein said base semiconductor portion comprises silicon; and wherein said at least one non-semiconductor monolayer comprises oxygen.

19. The semiconductor device of claim 15 wherein opposing base semiconductor portions in adjacent groups of layers of said at least one superlattice are chemically bound together.

20. A semiconductor device comprising:
   a thyristor comprising plurality of stacked semiconductor layers having alternating first and second conductivity types; and
   a control gate coupled to said thyristor;
   at least one of said layers of said stack of semiconductor layers comprising a superlattice including a plurality of stacked groups of layers with each group of layers of said superlattice comprising a plurality of stacked base semiconductor monolayers defining a base semiconductor portion and at least one non-semiconductor monolayer constrained within a crystal lattice of adjacent base semiconductor portions.

21. The semiconductor device of claim 20 wherein said at least one layer of said stack of semiconductor layers comprises an uppermost layer of said plurality of stacked semiconductor layers.

22. The semiconductor device of claim 21 further comprising a voltage reference contact on said uppermost layer of said plurality of stacked semiconductor layers.

23. The semiconductor device of claim 20 wherein said base semiconductor portion comprises silicon; and wherein said at least one non-semiconductor monolayer comprises oxygen.

24. The semiconductor device of claim 20 wherein opposing base semiconductor portions in adjacent groups of layers of said superlattice are chemically bound together.

* * * * *